United States Patent
Toyama et al.

[11] Patent Number: 6,054,024
[45] Date of Patent: Apr. 25, 2000

[54] APPARATUS FOR FORMING TRANSPARENT CONDUCTIVE FILM BY SPUTTERING AND METHOD THEREFOR

[75] Inventors: Noboru Toyama, Hirakata; Keishi Saito, Nara; Ryo Hayashi, Tsukuba; Yukiko Iwasaki, Nara, all of Japan

[73] Assignee: Canon Kabushiki Kaisha, Japan

[21] Appl. No.: 08/927,395

[22] Filed: Sep. 10, 1997

[30] Foreign Application Priority Data

Sep. 12, 1996 [JP] Japan ................................... 8-242398

[51] Int. Cl.⁷ .................................................. C23C 14/34
[52] U.S. Cl. .............................. 204/192.29; 204/192.12; 204/192.25; 204/192.26; 204/298.06; 204/298.23; 204/298.34
[58] Field of Search .................... 204/192.12, 192.14, 204/192.25, 192.26, 192.29, 298.06, 298.08, 298.23, 298.34

[56] References Cited

U.S. PATENT DOCUMENTS

| | | | |
|---|---|---|---|
| 4,392,931 | 7/1983 | Maniv et al. | 204/192.12 |
| 4,728,406 | 3/1988 | Banerjee et al. | 204/192.29 |
| 4,816,126 | 3/1989 | Kamoshida et al. | 204/192.3 |
| 5,135,581 | 8/1992 | Tran et al. | 204/192.29 |

*Primary Examiner*—Rodney McDonald
*Attorney, Agent, or Firm*—Fitzpatrick, Cella, Harper & Scinto

[57] ABSTRACT

There are provided a method which, in forming a transparent conductive film by sputtering on a semiconductor junction layer provided on a conductive substrate which bears at least the transparent conductive film thereon, comprises steps of electrically insulating the conductive substrate, and maintaining the self bias voltage Vself of the conductive substrate within a range of $-50\ V \leq Vself < 0\ V$, and an apparatus therefor. There can also be reduced the damage to the semiconductor layer, induced by the cations such as $Ar^+$. Thus there can be produced the photovoltaic elements of a high open-circuit voltage and a high photoelectric conversion efficiency in stable manner.

18 Claims, 5 Drawing Sheets

6,054,024

APPARATUS FOR FORMING TRANSPARENT CONDUCTIVE FILM BY SPUTTERING AND METHOD THEREFOR

BACKGROUND OF THE INVENTION

1. Field of the Invention

The present invention relates to an apparatus for forming a transparent conductive film by sputtering and a method therefor, and more particularly to an apparatus and method capable, in forming a transparent conductive film by sputtering, of preventing destruction (shortcircuiting) of the semiconductor junction layer and reducing the damage thereto by plasma.

2. Related Background Art

The configuration of the conventional photovoltaic element consists, for example, of a reflective layer, a semiconductor junction layer and a transparent conductive film formed in succession on a conductive substrate.

The transparent conductive film mentioned above is often formed by evaporation or DC magnetron sputtering. The evaporation method, generally having a low deposition rate for the transparent conductive film, is not suitable for mass production. On the other hand, the DC magnetron sputtering is widely used because a high deposition rate can be easily obtained.

FIG. 6 shows an example of the DC magnetron sputtering apparatus for depositing the transparent conductive film on a continuous conductive substrate. In the apparatus shown in FIG. 6, a conductive substrate 1101, bearing thereon a reflective layer and a semiconductor junction layer in succession, moves through a vacuum chamber 1104 by a roll-to-roll system. In this operation, the conductive substrate 1101 is maintained at the ground potential, same as the potential of the vacuum chamber 1104, and serves also as an anode electrode. The semiconductor junction layer, at the outermost surface of the conductive substrate 1101, is the surface receiving the deposition Lr, of the transparent conductive film and directed to a cathode electrode 1106. In FIG. 6 there are also shown rollers 1102, 1103, 1102a, 1103a, a target 1105, a cathode electrode 1106, a magnet 1107, a DC power source 1108, a voltmeter 1109, a heater 1110, and a sensor 1111. The vacuum chamber 1104 is composed of a substrate feeding chamber 1121, a film forming chamber 1122 and a substrate take-up chamber 1123.

The transparent conductive film is formed on the semiconductor junction layer by applying a predetermined DC voltage between the cathode electrode and the anode electrode, thereby sputtering the target material, placed on the cathode electrode, for forming the transparent conductive film.

However, in case of depositing the transparent conductive film on the conductive substrate by the above-mentioned apparatus for forming the transparent conductive film by sputtering, a DC current according to the output of the DC power source is generated in the conductive substrate serving also as the anode electrode, from the semiconductor junction layer at the outermost surface toward the conductive substrate. The current is concentrated in an electrically weak portion of the semiconductor junction layer, thereby causing destruction (shortcircuiting) in such portion. As a result, the photovoltaic element becomes incapable of performing its function.

Also if the self bias voltage Vself of the continuous conductive substrate becomes excessively negative, the semiconductor junction layer receives increased plasma damage by cations such as $Ar^+$, whereby the photovoltaic element becomes incapable of performing its function.

The self bias voltage means a potential difference generated between the conductive substrate and the vacuum chamber, and more specifically the potential of the conductive substrate when the potential of the vacuum chamber is taken as 0.

SUMMARY OF THE INVENTION

The object of the present invention is to provide an apparatus for forming the transparent conductive film by sputtering, the apparatus being capable, in such film formation, of preventing the destruction (short-circuiting) of the semiconductor junction layer and reducing the plasma damage to the semiconductor junction layer, and a method therefor.

The above-mentioned object can be attained, according to the present invention, by an apparatus for forming, by sputtering, a transparent conductive film on a semiconductor junction layer formed on a conductive substrate, which is provided thereon at least with the semiconductor junction layer, the apparatus comprising means for electrically insulating the conductive substrate and means for maintaining the self bias voltage Vself of the conductive substrate within a range of $-50\ V \leq Vself < 0\ V$.

According to the present invention there is also provided a method for forming, by sputtering, a transparent conductive film on a semiconductor junction layer formed on a conductive substrate, which is provided thereon at least with the semiconductor junction layer, the method comprising steps of electrically insulating the conductive substrate and maintaining the self bias voltage Vself of the conductive substrate within a range of $-50\ V \leq Vself < 0\ V$.

The above-mentioned apparatus and method suppresses the DC current from the semiconductor layer at the surface of the substrate toward the conductive substrate, at the formation of the transparent conductive film on the semiconductor junction layer. It is thus rendered possible to prevent the destruction (shortcircuiting) of the semiconductor junction layer, and to reduce the damage caused in the semiconductor layer by cations such as $Ar^+$.

Furthermore, according to the present invention, there is provided a method for producing the photovoltaic element, utilizing the above-mentioned method. According to the present invention, it is rendered possible to produce, in a stable manner, the photovoltaic element having a high open-circuit voltage and an excellent photoelectric conversion efficiency.

DESCRIPTION OF THE PREFERRED EMBODIMENTS

In the following the present invention will be clarified in detail by preferred embodiments thereof, with reference to the attached drawings.

[Apparatus for forming transparent conductive film by sputtering]

Figure 1:
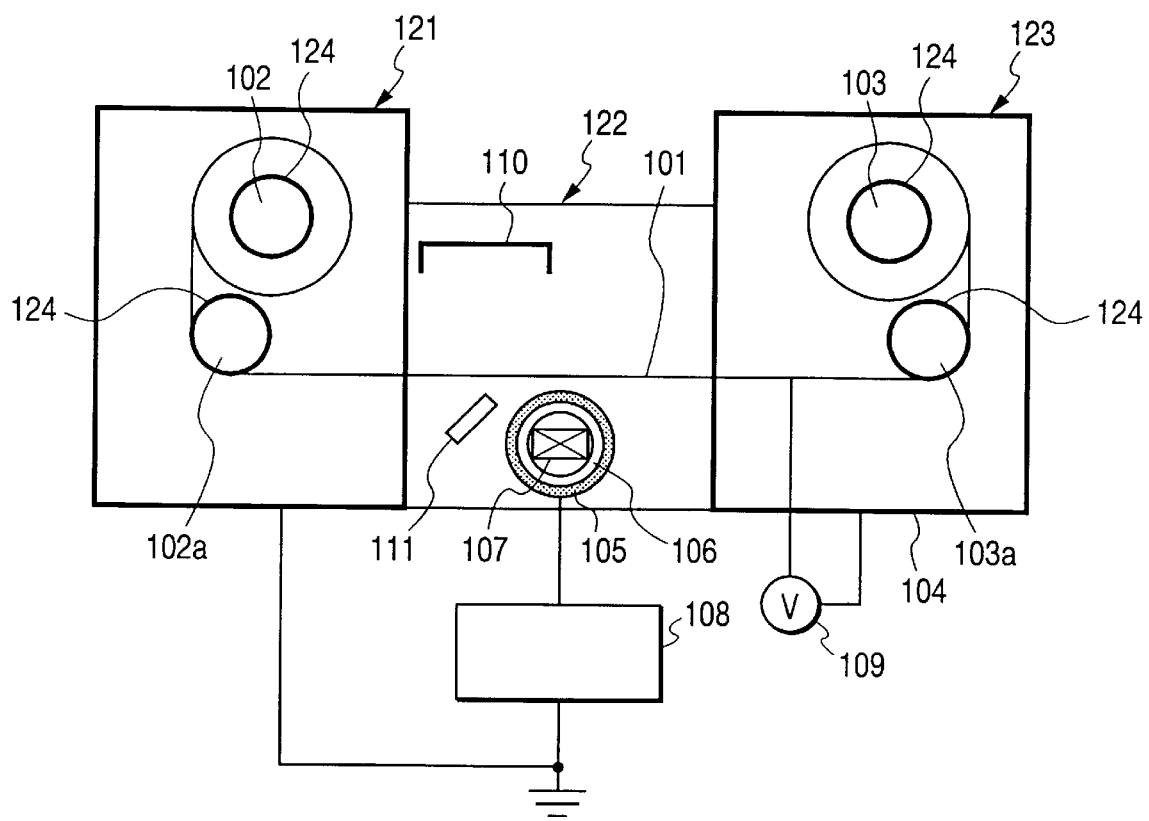
FIG. 1 is a schematic cross-sectional view of an apparatus of the present invention for forming the transparent conductive film by sputtering.

FIG. 1 is a schematic view of an apparatus of the present invention for forming the transparent conductive film by sputtering. The apparatus shown in FIG. 1 employs a cylindrical rotary target and deposits a transparent conductive film by DC magnetron sputtering method on a continuous substrate while it is moved by a roll-to-roll system.

In FIG. 1, there are shown a substrate 101, a substrate feeding roller 102, a substrate take-up roller 103, a vacuum chamber 104, a target 105, a cathode electrode 106, a magnet 107, a DC power source 108, a voltmeter 109, a heater 110, and a sensor 111.

The vacuum chamber 104 is composed of a substrate feeding chamber 121, a film forming chamber 122 and a substrate take-up chamber 123, the interiors of which are respectively evacuated by unrepresented vacuum pumps.

The substrate 101 is composed of a conductive substrate 131, which is provided thereon with a reflective layer 132 and a semiconductor junction layer 133 in succession. A preferred example of the detailed structure of the substrate 101 is illustrated in FIG. 3, which is referred to in the following description.

The conductive substrate 131 (or 301 in FIG. 3) is preferably composed of a stainless steel (SUS 430) plate of which surface is subjected to a BA (bright anneal) treatment. Instead of the stainless steel plate, there may also be employed a zinc-plated steel plate, an aluminum plate or various plated steel plates may be employed as the conductive substrate 131.

Figure 3:
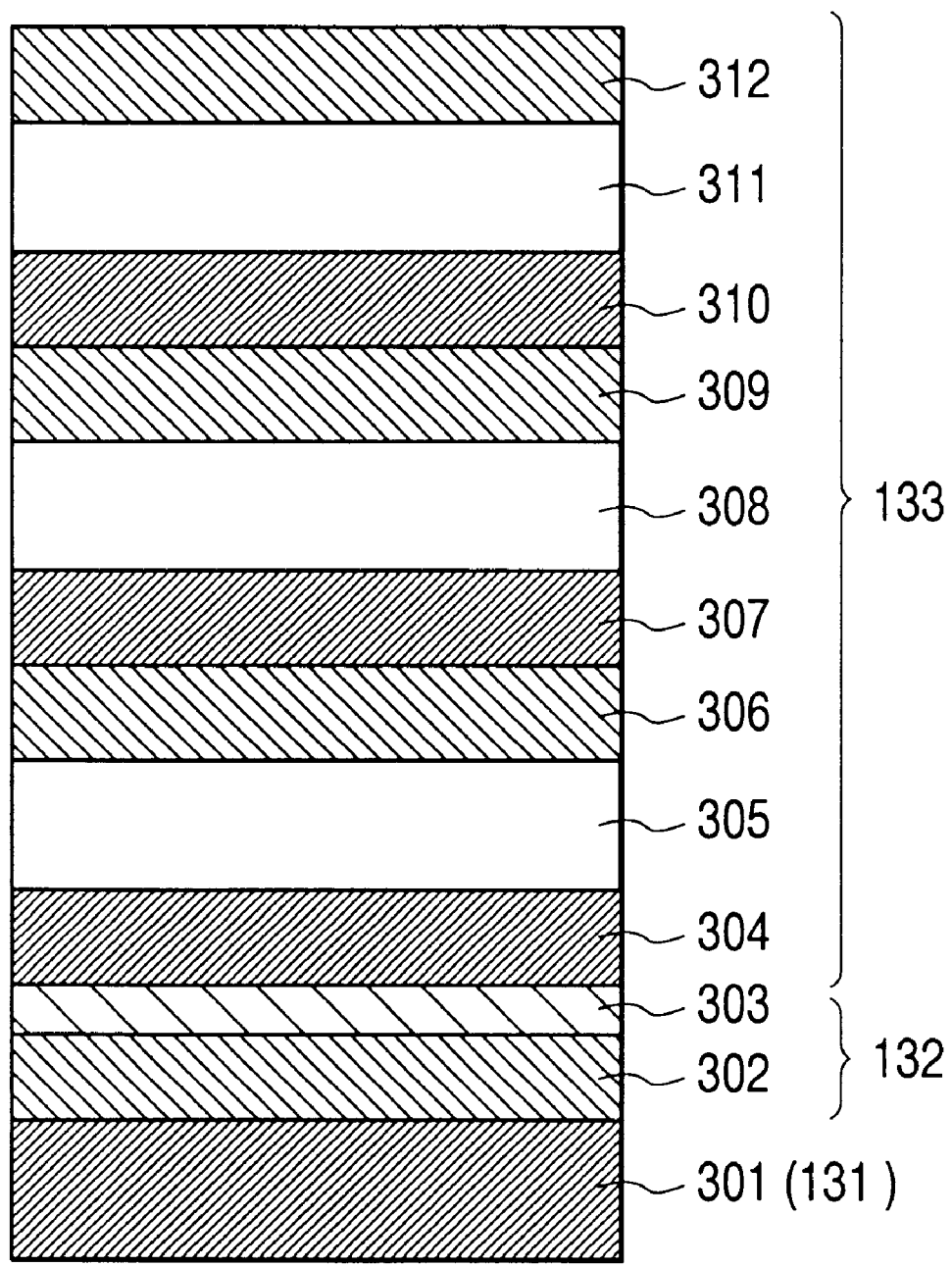
FIG. 3 is a schematic cross-sectional view of a substrate employed in the deposition of the transparent conductive film of the present invention.

The reflective layer 132 can be preferably composed of an aluminum layer 302 and a zinc oxide layer 303, deposited in succession by DC magnetron sputtering on the conductive substrate 131 (301 in FIG. 3).

The semiconductor junction layer 133 has a triple cell structure, in which three nip junctions are stacked. More specifically it is composed of a bottom cell, which consists of an n-type a-Si layer 304, an i-type a-SiGe layer 305 and a p-type a-Si layer 306; a middle cell, which consists of an n-type a-Si layer 307, an i-type a-SiGe layer 308 and a p-type a-Si layer 309; and a top cell, which consists of an n-type a-Si layer 310, an i-type a-Si layer 311 and a p-type a-Si layer 312.

These semiconductor layers may be composed of non-monocrystalline materials such as amorphous, microcrystalline or polycrystalline materials and are not particularly limited to monocrystalline materials. Also the number of stacks of the nip junctions may be 1 or, or larger (the configuration being called single cell in case of 1 and tandem cell in case of 2). Also the semiconductor junction layer 133 is not limited to nip junctions but may also be composed of pin junctions.

The substrate 101 of the above-explained configuration is wound in such a manner that the conductive substrate 131 is in contact with the substrate feeding roller 102, and is taken up, by unrepresented transporting means, by the substrate take-up roller 103 as shown in FIG. 1.

In the present embodiment, a polyimide film 124 is adhered, with double-stick tape, on the surface of the rollers 102, 102a, 130, 130a coming into contact with the conductive substrate 131, thereby constituting means for electrically insulating the conductive substrate (for maintaining the conductive substrate in the floating state). The above-mentioned means maintains the conductive substrate 131 in a state electrically insulated (floating) with respect to the ground potential of the vacuum chamber 104. The electrical insulating means may otherwise be formed by a resin coating such as of Teflon, or by adhesion of an insulating material such as paper, or impregnation of the surface of each roller with resin such as Teflon. Also instead of covering the roller surface with the insulating material, there may be employed a resin bearing such as of Teflon or Delryn for the shaft of each roller. Furthermore, these means may be employed in combination.

The cathode electrode 106 is preferably composed of a stainless steel tube. On the outer periphery of the cathode electrode 106, there is bonded a target 105 consisting of an alloy of indium and tin. The DC power source 108 is so connected that the vacuum chamber 104 constitutes the anode electrode, and applies a voltage between the cathode electrode 106 and the vacuum chamber 104.

The voltmeter 109 serves to measure the self bias voltage Vself generated between the vacuum chamber 104 and the conductive substrate 131 in the course of deposition of the transparent conductive film. The self bias voltage Vself is regulated by suitable selection of the sputtering conditions (applied DC power, film forming pressure, distance between the substrate and the target, magnetic field intensity etc.). In particular, in order to reduce the plasma damage to the semiconductor junction layer by the cations such as $Ar^+$, the sputtering conditions are so selected that the self bias voltage Vself is preferably maintained within a range of $-50 \text{ V} \leq \text{Vself} < 0 \text{ V}$, more preferably $-30 \text{ V} \leq \text{Vself} < 0 \text{ V}$, and most preferably $-20 \text{ V} \leq \text{Vself} < 0 \text{ V}$. In the apparatus of the present invention, means for maintaining the self bias voltage Vself of the conductive substrate within the range $-50 \text{ V} \leq \text{Vself} < 0 \text{ V}$ are the mechanisms for controlling the above-mentioned sputtering conditions.

The heater 110 is composed of a sheath heater, and is so controlled that a thermocouple, provided at a point A directly above the substrate 101, provides a constant indication.

The sensor 111 serves to observe the light emission intensity of the plasma, and is used for controlling the introduced flow rate of oxygen ($O_2$) as a reactive gas, in such a manner that the light emission intensity of indium, within the entire light emission, becomes constant.

Figure 2:
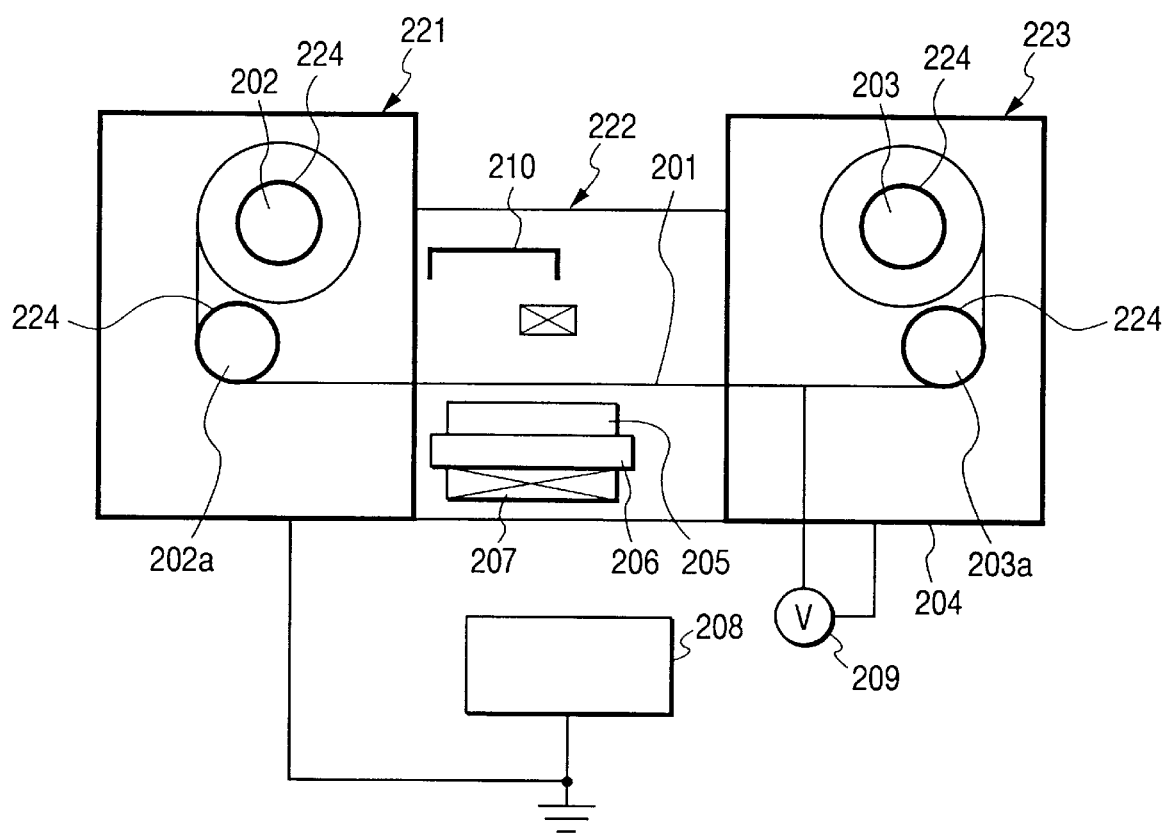
FIG. 2 is a schematic cross-sectional view of another apparatus of the present invention for forming the transparent conductive film by sputtering.

FIG. 2 is a schematic view of another apparatus of the present invention for forming the transparent conductive film by sputtering. The apparatus shown in FIG. 2 employs a fixed flat target, and forms the transparent conductive film by DC magnetron sputtering method on the continuous substrate while it is moved by a roll-to-roll system.

In FIG. 2, there are show n a substrate 201, a substrate feeding roller 2 02, a substrate take-up roller 203, a vacuum chamber 204, a target 205, a cathode electrode 206, a magnet 207, a DC power source 208, a voltmeter 209, a heater 210, and an insulating material 224 such as a polyimide film.

The vacuum chamber 204 is composed of a substrate feeding chamber 221, a film forming chamber 222 and a substrate take-up chamber 223, the interiors of which are respectively evacuated by unrepresented vacuum pumps.

[Method for forming transparent conductive film by sputtering]

In the following, there will be explained a method of forming the transparent conductive film by the apparatus of the above-explained configuration (FIG. 1), according to the process steps.

At first, the substrate 101 wound on the substrate feeding roller 102 is mounted in the substrate feeding chamber 121, and is fixed to the substrate take-up roller 103 through the rollers 102a, 103a as shown in FIG. 1. Each of the rollers is provided with the aforementioned means for electrically insulating the conductive substrate. The electrically insulated (floating) state is confirmed by detaching the voltmeter 109 a nd measuring the electrical resistance between the substrate 101 (conductive substrate 131) and the vacuum chamber 104. The electrical resistance, which should be as high as possible in order to reduce the current flowing therein, is preferably at least 300 kΩ, more preferably at least 600 kΩ, and most preferably 800 kΩ.

Then the interior of the vacuum chamber 104 is evacuated by a represented vacuum chamber to a suitable level of vacuum, and for example argon gas is then introduced into the vacuum chamber 104. Then the substrate 101 is moved, while heating to a predetermined temperature by the heater 110, with a transporting speed at which the transparent conductive film of a desired thickness is formed.

Subsequently, the transparent conductive film is formed on the surface of the substrate 101, namely on the semiconductor junction layer 133, while a desired self bias voltage Vself is maintained by the adjustment of the film forming pressure by the electric power applied by the DC power source 108 and the flow rate of the argon gas and/or the aperture of the exhaust valve. Also at the formation of the transparent conductive film, a suitable amount of oxygen is introduced in such a manner that the light emission intensity of indium in the plasma is maintained constant.

For example, the self bias voltage can be reduced by an increase in the applied voltage. Also the self bias voltage can be reduced by a decrease in the film forming pressure (for example by reducing the Ar flow rate or by reducing the aperture of the valve). The self bias voltage, being negative, increases in the absolute value when it is reduced.

In the following the present invention will be clarified further by examples thereof, but it is to be understood that the present invention is by no means limited by such examples.

EXAMPLE 1

This example employed the apparatus shown in FIG. 1, and a photovoltaic element was prepared by forming the transport conductive film with a variation of the self bias voltage Vself within a range of $-70 \text{ V} \leq \text{Vself} \leq +10 \text{ V}$.

The conductive substrate 131 (301 in FIG. 3) used was a stainless steel (SUS 430) plate of a thickness of 0.2 mm, a width of 300 mm and a length of 300 m, of which surface was subjected to BA treatment.

The substrate 101 was provided, on the conductive substrate 131, in succession with the reflective layer 132 and the semiconductor junction layer (triple cell type shown in FIG. 3) 133.

The cathode electrode 106 was composed of a stainless steel tube with an external diameter of 20 cm, an internal diameter of 18 cm and a length of 50 cm. On the external periphery of the cathode electrode 106, there was bonded a target 105 of an alloy of indium and tin (indium: tin=95:5 (wt. %)). At the formation of the transparent conductive film, the target 105 and the cathode electrode 106 were rotated clockwise, toward the plane of FIG. 1, at a rate of 3 rpm. The distance between the target 105 and the substrate 101 was adjusted at 50 mm. The DC power source 108 was so connected that the vacuum chamber 104 constitutes the anode electrode, and applied the voltage between the cathode electrode 106 and the vacuum chamber 104.

In the following the method of forming the transparent conductive film will be explained according to the process steps.

(1) At first a polyimide film was adhered, with a double-stick tape, to the surface of each of the rollers 102, 102a, 103, 103a coming into contact with the conductive substrate 131, as means for electrically insulating the conductive substrate (means for maintaining the substrate in floating state).

Then the substrate 101 wound on the substrate feeding roller 102 was mounted in the substrate feeding chamber 121 and was guided, through the rollers 102a, 103a as shown in FIG. 1, to the substrate take-up roller 103.

(2) The voltmeter 109 was detached, and the electrical resistance between the conductive substrate 131 and the vacuum chamber 104 was measured with a tester. The measured resistance was in the order of MD, indicating that the substrate 101 was surely in the electrically insulated (floating) state.

(3) The interior of the vacuum chamber 104 was evacuated, with the unrepresented vacuum pump, to about $10^{-5}$ Torr, and Argon was introduced into the film forming chamber 122.

(4) The output of the heater 110 was so controlled that the thermocouple indicated 200° C. The transportation of the substrate 101 was started after 1 hour from the activation of the heater 110. The transporting speed of the substrate was so controlled that the film thickness was about 70 nm.

(5) The transparent conductive film was formed on the surface of the substrate 101, namely on the semiconductor junction layer 133, with the variation of the self bias voltage Vself in a range of $-70 \text{ V} \leq \text{Vself} < 0 \text{ V}$ through the adjustment of the film forming pressure by the electric power applied by the DC power source 108 and the argon gas flow rate and/or the aperture of the exhaust valve.

Also in the course of film formation, the film was also formed at Vself=0 V by shortcircuiting the electrical insulation. The film formation was also conducted under the application of the self bias voltage Vself within a range of $0 \text{ V} < \text{Vself} \leq +10 \text{ V}$ by means of the DC power source.

At the formation of the transparent conductive film, oxygen was introduced in such a manner that the light emission intensity of indium in the plasma became constant.

A photovoltaic element of a configuration of (conductive substrate/reflective layer/semiconductor junction layer/ transparent conductive layer) was formed through the steps (1) to (5) explained above.

After the formation of the transparent conductive film with the variation in the self bias voltage Vself, specimens of the photovoltaic element of a width of 30 cm were cut out at an interval of 20 m and subjected to the measurement of the open-circuit voltage under a fluorescent lamp of 200 lux. The results of measurement are shown in FIG. 4.

Then, on the transparent conductive film of each of the specimens used for the measurement of the open-circuit voltage, a current-collecting electrode was formed by screen printing of silver paste, and the obtained photovoltaic elements were subjected to the measurement of the photoelectric conversion efficiency under the illumination with the light of AM 1.5 (100 mW/cm$^2$). The obtained results are shown in FIG. 5.

Figure 4:
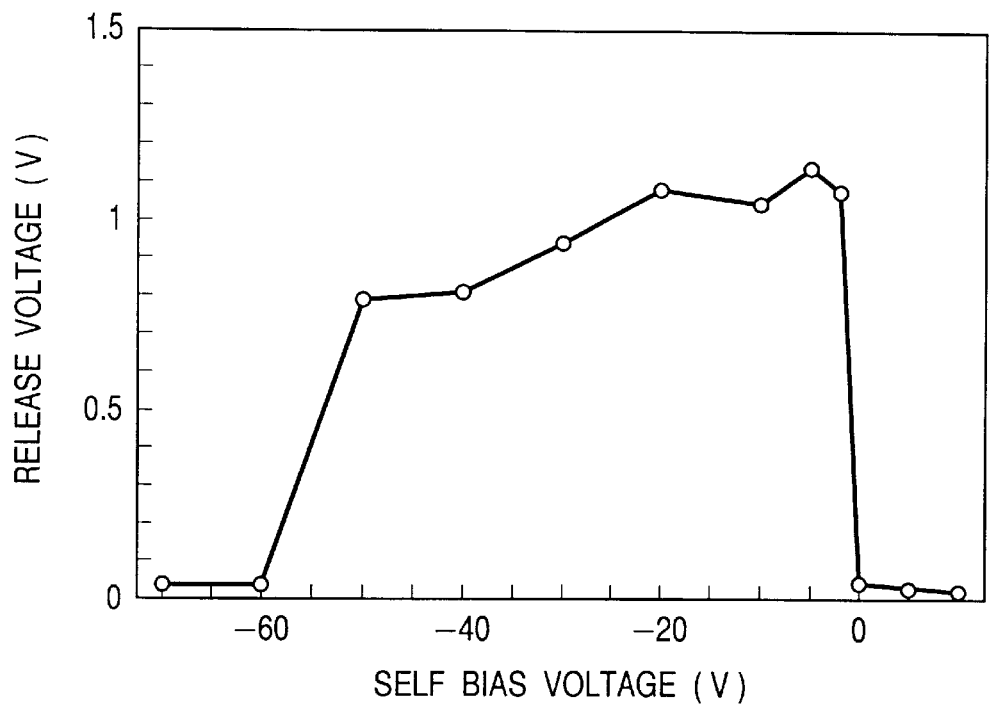
FIG. 4 is a chart showing the relationship between the self bias voltage Vself and the open-circuit voltage Voc.
Figure 5:
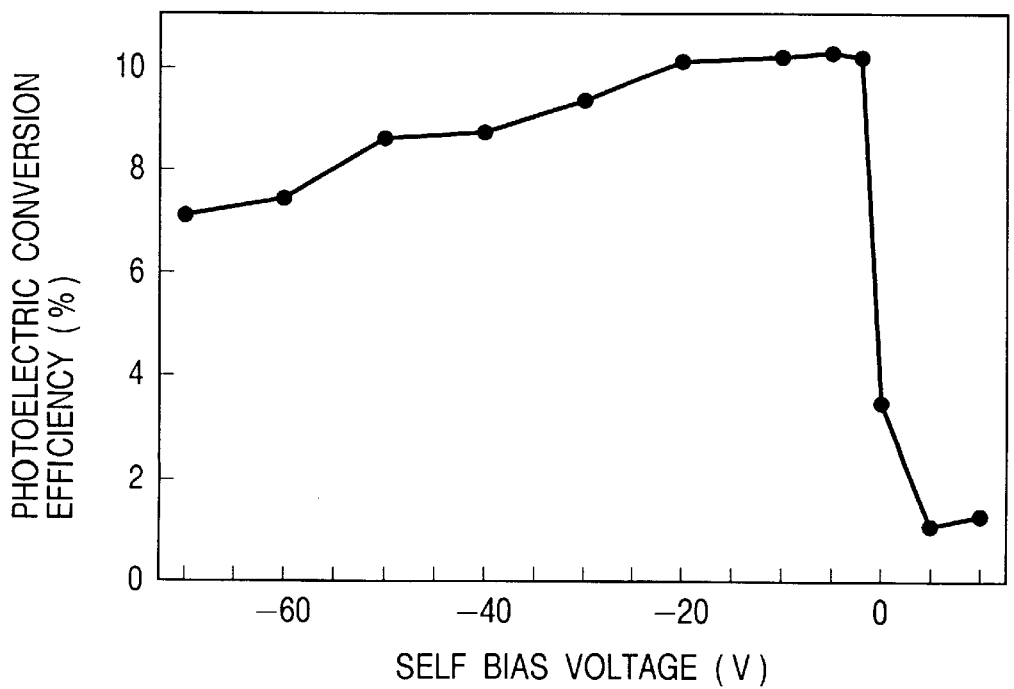
FIG. 5 is a chart showing the relationship between the self bias voltage Vself and the photoelectric conversion efficiency.
Figure 6:
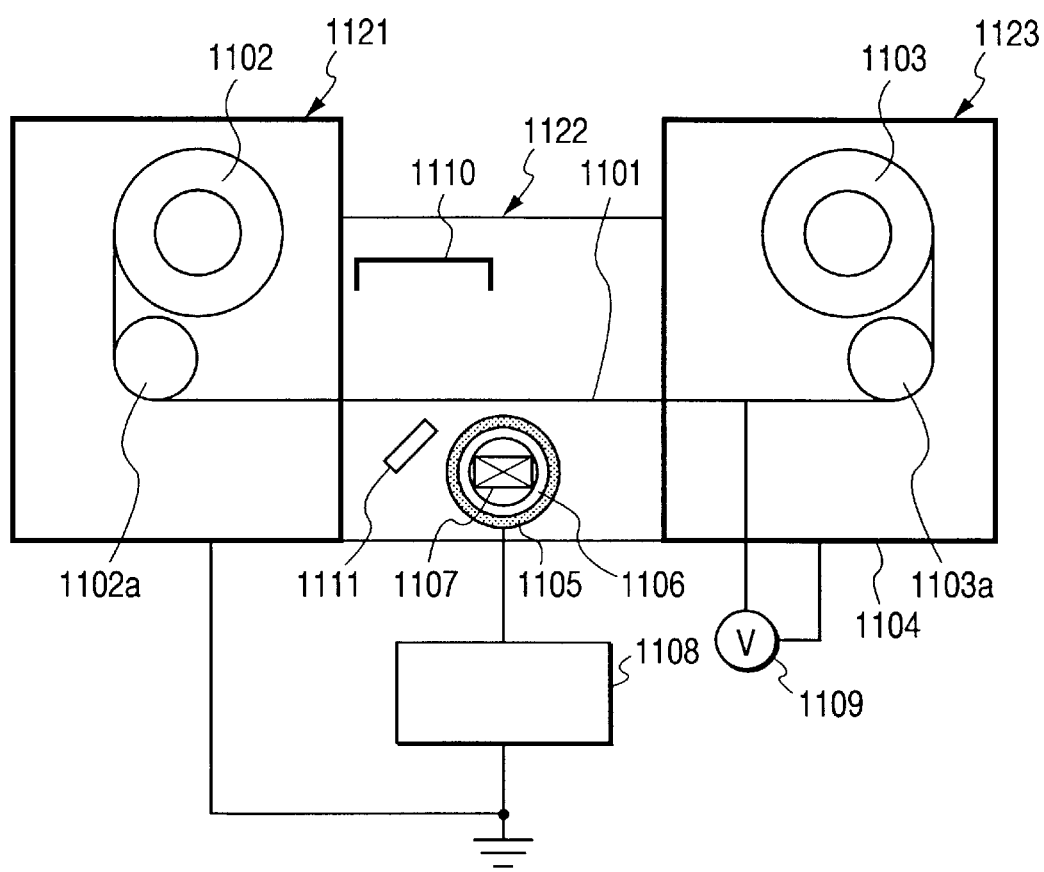
FIG. 6 is a schematic cross-sectional view of a conventional apparatus for forming the transparent conductive film by sputtering.

The results in FIGS. 4 and 5 indicate that the performance of the photovoltaic element is significantly deteriorated if the self bias voltage Vself is equal to or higher than 0 V. This result is presumably ascribable to a fact that a DC current is generated, according to the output of the DC power source, in the conductive substrate functioning as the cathode electrode, from the surface of the semiconductor junction layer toward the conductive substrate and such current is concentrated in the electrically weaker portion of the semiconductor junction layer, thereby inducing a shortcircuiting in such weaker portion.

The performance of the photovoltaic element is also deteriorated if the self bias voltage Vself becomes excessively large in the negative side (if smaller than −50 V). There is particularly observed a decrease in the open-circuit voltage under a low illumination intensity, as shown in FIG. 4. This is presumably due to increased plasma damage to the semiconductor junction layer by the cations such as $Ar^+$.

It is therefore concluded to be preferable, in order to prevent the destruction (shortcircuiting) in the semiconductor junction layer and to suppress the plasma damage thereto, to electrically insulate the conductive substrate (in a floating state) and maintain the self bias voltage Vself of the conductive substrate within a range of −50 V≦Vself<0 V.

EXAMPLE 2

In this example, the transparent conductive film was formed by the magnetron sputtering apparatus shown in FIG. 2. The cathode electrode unit was composed of a backing plate 206, a target 205 bonded to the backing plate, and a magnet 207. The employed target was an oxide target consisting of indium oxide and tin oxide (indium oxide: tin oxide=90:10 (wt. %), size 10"×20"×¼").

The substrate 201 was provided, on the conductive substrate 231, in succession with the reflective layer 232 and the semiconductor junction layer (single cell type) 233.

The semiconductor junction layer 233 was obtained by forming, in succession on the reflective layer 232, an n-type a-Si layer with $SiH_4$, $PH_3$ and $H_2$ as the raw material gasses, then an i-type a-SiGe layer with $SiH_4$, $GeH_4$ and $H_2$, and a p-type μc-Si layer with $SiH_4$, $BF_3$ and $H_2$.

Other conditions are same as those in example 1.

In the following, the method of forming the transparent conductive film will be explained according to the process steps.

(1) At first a polyimide film was adhered, with a double-stick tape, to the surface of each of the rollers 202, 202a, 203, 203a coming into contact with the conductive substrate 231, as means for electrically insulating the conductive substrate (means for maintaining the substrate in floating state).

Then the substrate 201 wound on the substrate feeding roller 202 was mounted in the substrate feeding chamber 121 and was guided, through the rollers 202a, 203a as shown in FIG. 2, to the substrate take-up roller 203.

(2) The voltmeter 209 was detached, and the electrical resistance between the conductive substrate 131 and the vacuum chamber 104 was measured with a tester. The measured resistance was in the order of MΩ, indicating that the substrate 101 was surely in the electrically insulated (floating) state.

(3) The interior of the vacuum chamber 204 was evacuated, with the unrepresented vacuum pump, to about $10^{-5}$ Torr, and Argon was introduced into the film forming chamber 222.

(4) The output of the heater 210 was so controlled that the thermocouple indicated 200° C. The transportation of the substrate 201 was started after 1 hour from the activation of the heater 210. At the same time, oxygen was introduced with a flow rate of 100 sccm. The transporting speed of the substrate was selected as 50 cm/min.

(5) The transparent conductive film was formed on the surface of the substrate 201, namely on the semiconductor junction layer 233, with the application of a power of 4 kW by the DC power source 208. The self bias voltage Vself, indicated by the voltmeter 209 in the course of deposition of the transparent conductive film, was −2 V.

A photovoltaic element of a configuration of (conductive substrate/reflective layer/semiconductor junction layer/transparent conductive layer) was formed through the steps (1) to (5) explained above.

The photovoltaic elements prepared in this example were cut out with a width of 30 cm and at an interval of 20 m and subjected to the measurement of the open-circuit voltage under a fluorescent lamp of 200 lux. As a result, the open-circuit voltage was satisfactory within a range of 0.45 V±0.03 V.

Also the photovoltaic elements prepared in this example were cut out with a width of 30 cm and at an interval of 20 m and subjected to the formation of a current-collecting electrode by screen printing of silver paste, and subjected to the measurement of the photoelectric conversion efficiency under the illumination with the light of AM 1.5 (100 $mW/cm^2$). The obtained photoelectric conversion efficiency was satisfactory within a range of 7.2±0.2%.

REFERENCE EXAMPLE 1

In this example, the transparent conductive film was prepared in the same manner as in the example 2, except that the conductive substrate 201 was electrically connected with the vacuum chamber 204. More specifically, the conductive substrate 201 was in electrical contact with the rollers 202, 202a, 203, 203a.

The photovoltaic elements prepared in this example were cut out with a width of 30 cm and at an interval of 20 m and subjected to the measurement of the open-circuit voltage under a fluorescent lamp of 200 lux. As a result, the open-circuit voltage was low and did not exceed 0.03 V.

Also the photovoltaic elements prepared in this example were cut out with a width of 30 cm and at an interval of 20 m and subjected to the formation of a current-collecting electrode by screen printing of silver paste, and subjected to the measurement of the photoelectric conversion efficiency under the illumination with the light of AM 1.5 (100 $mW/cm^2$). The obtained photoelectric conversion efficiency was 2.5% at maximum.

Also the surface of the photovoltaic element was observed with an IR camera, when a DC current of 20 mA was made to flow between the current-collecting electrode of the photovoltaic element as anode electrode and the conductive substrate 201 thereof as cathode electrode. As a result, current paths were observed over the entire area of the photovoltaic element, presumably because of the following reason.

As the conductive substrate 201 is electrically linked with the vacuum chamber 204 at the formation of the transparent conductive film, the conductive substrate 201 served as the anode electrode. As a result, a DC current corresponding to the output of the DC power source was generated from the semiconductor junction layer at the surface toward the conductive substrate. The current was concentrated in the electrically weaker portion of the semiconductor junction layer, thereby generating destruction (shortcircuit) in such portion.

REFERENCE EXAMPLE 2

In this example, the self bias voltage Vself, indicated by the voltmeter 209 in the course of deposition of the transparent conductive film, was selected as −70 V. The steps of this example were same as those of the example 2, except that the steps (3) to (5) were modified as follows in order to select Vself=−70 V:

(3') The interior of the vacuum chamber 204 was evacuated, with the unrepresented vacuum pump, to about $10^{-5}$ Torr, and Argon was introduced into the film forming chamber 122 at a rate of 200 sccm to a level of vacuum of 1.5 mTorr.

(4') The output of the heater 210 was so controlled that the thermocouple indicated 200° C. The transportation of the substrate 201 was started after 1 hour from the activation of the heater 210. At the same time, oxygen was introduced with a flow rate of 30 sccm. The transporting speed of the substrate was selected as 65 cm/min.

(5') The transparent conductive film was formed on the surface of the substrate 201, namely on the semiconductor junction layer 233, with the application of a power of 4 kW by the DC power source 208. The self bias voltage Vself, indicated by the voltmeter 209 in the course of deposition of the transparent conductive film, was −70 V.

The photovoltaic elements prepared in this example were cut out with a width of 30 cm and at an interval of 20 m and subjected to the measurement of the open-circuit voltage under a fluorescent lamp of 200 lux. The measured open-circuit voltage was as low as 0.05 V or less in 80% of the samples.

Also the photovoltaic elements prepared in this example were cut out with a width of 30 cm and at an interval of 20 m and subjected to the formation of a current-collecting electrode by screen printing of silver paste, and subjected to the measurement of the photoelectric conversion efficiency under the illumination with the light of AM 1.5 (100 mW/cm$^2$). The obtained photoelectric conversion efficiency was as low as 4.2% or less in 80% of the samples.

Also the surface of the photovoltaic element was observed with an IR camera, when a DC current of 20 mA was made to flow between the current-collecting electrode of the photovoltaic element as anode electrode and the conductive substrate 201 thereof as cathode electrode. As a result, there were observed ball-shaped current paths of a diameter of about 3 mm in certain locations of the surface of the photovoltaic element. This state is presumed to be induced, at the formation of the transparent conductive film, by the plasma damage of the semiconductor junction layer by cations such as Ar$^+$, leading to the destruction (shortcircuiting).

EXAMPLE 3

In this example, the self bias voltage Vself, indicated by the voltmeter 109 in the course of deposition of the transparent conductive film, was selected as −5 V. The steps of this example were same as those of the example 1, except that the steps (3) to (5) were modified as follows in order to select Vself=−5 V:

(3") The interior of the vacuum chamber 104 was evacuated, with the unrepresented vacuum pump, to about $10^{-5}$ Torr, and Argon was introduced into the film forming chamber 122 at a rate of 1200 sccm to a level of vacuum of 21 mTorr.

(4") The output of the heater 110 was so controlled that the thermocouple indicated 200° C. The transportation of the substrate 101 was started after 1 hour from the activation of the heater 110. The transporting speed of the substrate was selected as 77 cm/min.

(5") The transparent conductive film was formed on the surface of the substrate 101, namely on the semiconductor junction layer 133, with the application of a power of 2.5 kW by the DC power source 108 and with the introduction of oxygen in such a manner that the light emission intensity of In became constant. The self bias voltage Vself, indicated by the voltmeter 109 in the course of deposition of the transparent conductive film, was −5 V.

The photovoltaic elements prepared in this example were cut out with a width of 30 cm and at an interval of 20 m and subjected to the measurement of the open-circuit voltage under a fluorescent lamp of 200 lux. As a result, the measured open-circuit voltage was satisfactory in a range of 1.15±0.05 V.

Also the photovoltaic elements prepared in this example were cut out with a width of 30 cm and at an interval of 20 m and subjected to the formation of a current-collecting electrode by screen printing of silver paste, and subjected to the measurement of the photoelectric conversion efficiency under the illumination with the light of AM 1.5 (100 mW/cm$^2$). As a result, the obtained photoelectric conversion efficiency was satisfactory in a range of 10.1±0.2%.

REFERENCE EXAMPLE 3

In this example, the self bias voltage Vself, indicated by the voltmeter 109 in the course of deposition of the transparent conductive film, was selected as −60 V. The steps of this example were same as those of the example 3, except that the steps (3") to (5") were modified as follows in order to select Vself=−60 V:

(3''') The interior of the vacuum chamber 104 was evacuated, with the unrepresented vacuum pump, to about $10^{-5}$ Torr, and Argon was introduced into the film forming chamber 122 at a rate of 100 sccm to a level of vacuum of 1.5 mTorr.

(4''') The output of the heater 110 was so controlled that the thermocouple indicated 200° C. The transportation of the substrate 101 was started after 1 hour from the activation of the heater 110. The transporting speed of the substrate was selected as 100 cm/min.

(5''') The transparent conductive film was formed on the surface of the substrate 101, namely on the semiconductor junction layer 133, with the application of a power of 4 kW by the DC power source 108. The self bias voltage Vself, indicated by the voltmeter 109 in the course of deposition of the transparent conductive film, was −60 V.

The photovoltaic elements prepared in this example were cut out with a width of 30 cm and at an interval of 20 m and subjected to the measurement of the open-circuit voltage under a fluorescent lamp of 200 lux. The measured open-circuit voltage was as low as 0.03 V or less in 90% of the samples.

Also the photovoltaic elements prepared in this example were cut out with a width of 30 cm and at an interval of 20 m and subjected to the formation of a current-collecting electrode by screen printing of silver paste, and subjected to the measurement of the photoelectric conversion efficiency under the illumination with the light of AM 1.5 (100 mW/cm$^2$). The obtained photoelectric conversion efficiency was as low as 4.2% or less in 90% of the samples.

Also the surface of the photovoltaic element was observed with an IR camera, when a DC current of 20 mA was made to flow between the current-collecting electrode of the photovoltaic element as anode electrode and the conductive substrate 201 thereof as cathode electrode. As a result, there were observed oblong ball-shaped current paths of a diameter of about 30 to 50 mm in certain locations of the surface of the photovoltaic element. This state is presumed to be induced, at the formation of the transparent conductive film, by the plasma damage of the semiconductor junction layer by the cations such as $Ar^+$, leading to destruction (shortcircuiting).

EXAMPLE 4

In this example, the self bias voltage Vself, indicated by the voltmeter 109 in the course of deposition of the transparent conductive film, was selected as −18 V. The steps of this example were same as those of the example 1, except that the distance between the target 105 and the substrate 101 was modified to 500 mm and the substrate transporting speed was modified to 60 cm/min in order to obtain Vself=−18 V.

The photovoltaic elements prepared in this example were cut out with a width of 30 cm and at an interval of 20 m and subjected to the measurement of the open-circuit voltage under a fluorescent lamp of 200 lux. As a result, the measured open-circuit voltage was satisfactory in a range of 1.09±0.05 V.

Also the photovoltaic elements prepared in this example were cut out with a width of 30 cm and at an interval of 20 m and subjected to the formation of a current-collecting electrode by screen printing of silver paste, and subjected to the measurement of the photoelectric conversion efficiency under the illumination with the light of AM 1.5 (100 $mW/cm^2$). As a result, the obtained photoelectric conversion efficiency was satisfactory in a range of 10.0±0.2%.

In the present invention, as explained in the foregoing, at the formation of a transparent conductive layer by sputtering on the conductive substrate bearing thereon the reflective layer and the semiconductor junction layer in succession, the conductive substrate is maintained in an electrically insulated (floating) state whereby the DC current from the surface of the semiconductor junction layer toward the conductive substrate can be suppressed and the destruction (shortcircuiting) of the semiconductor junction layer can be prevented. Also the plasma damage to the semiconductor junction layer by the cations such as $Ar^+$ can be reduced at the formation of the transparent conductive film by sputtering on the semiconductor junction layer, by selecting the self bias voltage Vself of the conductive substrate within a range of −50 V≦Vself<0 V.

Consequently there can be produced photovoltaic elements of a high open-circuit voltage and a high photoelectric conversion efficiency in a stable manner.

What is claimed is:

1. An apparatus for forming, by sputtering, a transparent conductive film on to a semiconductor junction layer, said semiconductor junction layer being provided on a conductive substrate which bears at least said transparent conductive film thereon, comprising:

means for electrically insulating said conductive substrate; and means for maintaining a self bias voltage Vself of said conductive substrate within a range of −50 V≦Vself<0 V.

2. An apparatus according to claim 1, further comprising a vacuum chamber, wherein the resistance between said vacuum chamber and said conductive substrate is 300 kΩ or higher.

3. An apparatus according to claim 1, wherein said conductive substrate is a substrate of continuous form.

4. An apparatus according to claim 3, further comprising a vacuum chamber, wherein said continuous substrate is supported by plural rollers in said vacuum chamber.

5. An apparatus according to claim 4, wherein at least a part of each of said plural rollers is composed of an insulating material.

6. An apparatus according to claim 4, wherein said continuous substrate and said plural rollers are mutually electrically insulated by an insulating material.

7. An apparatus according to claim 4, wherein bearings of said plural rollers are composed of an insulating material.

8. An apparatus according to claim 1, wherein said substrate is provided with a reflective layer between said conductive substrate and said semiconductor junction layer.

9. A method for forming, by sputtering, a transparent conductive film on to a semiconductor junction layer, said semiconductor junction layer being provided on a conductive substrate which bears at least said transparent conductive film thereon, comprising steps of:

electrically insulating said conductive substrate; and maintaining a self bias voltage Vself of said conductive substrate within a range of −50 V≦Vself<0 V.

10. A method according to claim 9, wherein said sputtering is conducted in a vacuum chamber, and the resistance between said vacuum chamber and said conductive substrate is made 300 kΩ or higher.

11. A method according to claim 9, wherein said conductive substrate is a substrate of continuous form.

12. A method according to claim 11, wherein said sputtering is conducted in a vacuum chamber, and said continuous substrate is supported by plural rollers in said vacuum chamber.

13. A method according to claim 12, wherein at least a part of each of said plural rollers is composed of an insulating material.

14. A method according to claim 12, wherein said continuous substrate and said plural rollers are mutually electrically insulated by an insulating material.

15. A method according to claim 12, wherein bearings of said plural rollers are composed of an insulating material.

16. A method according to claim 9, wherein said substrate is provided with a reflective layer between said conductive substrate and said semiconductor junction layer.

17. A method according to claim 9, wherein said self bias voltage is regulated by adjustment of conditions for sputtering.

18. A method for producing a photovoltaic element including a step of forming, by sputtering, a transparent conductive film on to a semiconductor junction layer, said semiconductor junction layer being provided on a conductive substrate which bears at least said transparent conductive film thereon, wherein said step comprises steps of:

electrically insulating said conductive substrate; and maintaining a self bias voltage Vself of said conductive substrate within a range of −50 V≦Vself<0 V.

* * * * *

UNITED STATES PATENT AND TRADEMARK OFFICE
CERTIFICATE OF CORRECTION

PATENT NO. : 6,054,024
DATED : April 25, 2000
INVENTOR(S) : NOBORU TOYAMA ET AL.

Page 1 of 2

It is certified that error appears in the above-identified patent and that said Letters Patent is hereby corrected as shown below:

COLUMN 1:

Line 38, "Lr," should be deleted.

COLUMN 3:

Line 56, "or," should be deleted.

COLUMN 4:

Line 53, "show n" should read --shown--; and
Line 54, "2 02," should read --202,--.

COLUMN 5:

Line 8, "a nd" should read --and--.

COLUMN 6:

Line 17, "MD," should read --M$\Omega$,--.

UNITED STATES PATENT AND TRADEMARK OFFICE
CERTIFICATE OF CORRECTION

| | | |
|---|---|---|
| PATENT NO. | : | 6,054,024 |
| DATED | : | April 25, 2000 |
| INVENTOR(S) | : | NOBORU TOYAMA ET AL. |

It is certified that error appears in the above-identified patent and that said Letters Patent is hereby corrected as shown below:

<u>COLUMN 9</u>:

Line 50, "the" should be deleted.

Signed and Sealed this

Fifteenth Day of May, 2001

Attest:

NICHOLAS P. GODICI

*Attesting Officer*   *Acting Director of the United States Patent and Trademark Office*